United States Patent
Huang et al.

(10) Patent No.: US 8,616,433 B2
(45) Date of Patent: *Dec. 31, 2013

(54) FORMING LOW STRESS JOINTS USING THERMAL COMPRESS BONDING

(71) Applicant: Taiwan Semiconductor Manufacturing Company, Ltd., Hsin-Chu (TW)

(72) Inventors: Kuei-Wei Huang, Hsin-Chu (TW); Wei-Hung Lin, Xinfeng Township (TW); Lin-Wei Wang, Zhubei (TW); Bor-Ping Jang, Chu-Bei (TW); Ming-Da Cheng, Jhubei (TW); Chung-Shi Liu, Hsin-Chu (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 0 days.

This patent is subject to a terminal disclaimer.

(21) Appl. No.: 13/729,978

(22) Filed: Dec. 28, 2012

(65) Prior Publication Data

US 2013/0128486 A1    May 23, 2013

Related U.S. Application Data

(62) Division of application No. 12/841,882, filed on Jul. 22, 2010, now Pat. No. 8,360,303.

(51) Int. Cl.
 *B23K 31/02* (2006.01)
(52) U.S. Cl.
 USPC ................................ 228/180.22; 228/155
(58) Field of Classification Search
 None
 See application file for complete search history.

(56) References Cited

U.S. PATENT DOCUMENTS

| | | | |
|---|---|---|---|
| 4,878,611 A | 11/1989 | LoVasco et al. | |
| 5,726,501 A | 3/1998 | Matsubara | |
| 5,964,396 A | 10/1999 | Brofman et al. | |
| 5,968,670 A | 10/1999 | Brofman et al. | |
| 5,975,409 A | 11/1999 | Brofman et al. | |
| 6,890,795 B1 | 5/2005 | Wong et al. | |
| 7,271,497 B2 * | 9/2007 | Joshi et al. | 257/780 |
| 7,476,564 B2 * | 1/2009 | Chen et al. | 438/107 |
| 2001/0000925 A1 | 5/2001 | Caletka et al. | |

(Continued)

FOREIGN PATENT DOCUMENTS

| | | |
|---|---|---|
| JP | 02-206138 | 8/1990 |
| JP | 10-270838 | 10/1998 |
| JP | 2009-158563 | 7/2009 |

OTHER PUBLICATIONS

Machine translation of 10-270838A (no date available).*

*Primary Examiner* — Kiley Stoner
(74) *Attorney, Agent, or Firm* — Slater & Matsil, L.L.P.

(57) ABSTRACT

A method of forming a bump structure includes providing a first work piece including a dielectric layer having a top surface; placing a second work piece facing the first work piece; placing a heating tool contacting the second work piece; and heating the second work piece using the heating tool to perform a reflow process. A first solder bump between the first and the second work pieces is melted to form a second solder bump. Before the second solder bump solidifies, pulling the second work piece away from the first work piece, until an angle formed between a tangent line of the second solder bump and the top surface of the dielectric layer is greater than about 50 degrees, wherein the tangent line is drawn at a point where the second solder bump joins the dielectric layer.

13 Claims, 7 Drawing Sheets

(56) References Cited

U.S. PATENT DOCUMENTS

| | | |
|---|---|---|
| 2002/0109000 A1 | 8/2002 | Rinne |
| 2005/0275096 A1 | 12/2005 | Zeng et al. |
| 2006/0011711 A1 | 1/2006 | Mino |
| 2006/0263929 A1 | 11/2006 | Matsunami |
| 2008/0158843 A1 | 7/2008 | So et al. |
| 2009/0229853 A1 | 9/2009 | Fukuda |

\* cited by examiner

FORMING LOW STRESS JOINTS USING THERMAL COMPRESS BONDING

This application is a divisional of U.S. patent application Ser. No. 12/841,882 filed Jul. 22, 2010 entitled "Forming Low Stress Joints Using Thermal Compress Bonding," issued as U.S. Pat. No. 8,360,303, which application and patent are hereby incorporated herein by reference in their entireties.

TECHNICAL FIELD

This disclosure relates generally to integrated circuit manufacturing processes, and more particularly to forming low-stress joints using thermal compress bonding.

BACKGROUND

Integrated circuits are formed on semiconductor wafers, which are then sawed into semiconductor chips. The semiconductor chips are then bonded onto package substrates. FIGS. 1 through 3 illustrate cross-sectional views of intermediate stages of a conventional bonding process. Referring to FIG. 1, package substrate 100 is provided, and bond pads 108 are at the surface of package substrate 100. Chip 102 is picked up and flipped over, with solder bumps 104 at a surface of chip 102 facing down. Flux 106 is also applied on solder bumps 104.

Next, as shown in FIG. 2, chip 102 is placed on package substrate 100, with solder bumps 104 being placed against bond pads 108. Package substrate 100 and chip 102 then go through a reflow process, during which package substrate 100 and chip 102, and solder bumps 104 are heated. The resulting bonded structure is shown in FIG. 3. Due to the weight of chip 102 and solder bumps 104, solder bumps 104, when melted, are crushed, and width W1 of solder bumps 104 increases.

One of the problems found in the conventional bond structures is that cracking often occurs in solder bumps 104 after the bonding process, particularly near wherein solder bumps 104 join solder resists 112 and 114. In addition, due to the increase in width W1 of solder bumps 104, the spacing between neighboring solder bumps 104 need to be increased to prevent solder bumps 104 from shorting with each other.

SUMMARY

In accordance with one aspect, a method of forming a bump structure includes providing a first work piece including a dielectric layer having a top surface; placing a second work piece facing the first work piece; placing a heating tool contacting the second work piece; and heating the second work piece using the heating tool to perform a reflow process. A first solder bump between the first and the second work pieces is melted to form a second solder bump. Before the second solder bump solidifies, pulling the second work piece away from the first work piece, until an angle formed between a tangent line of the second solder bump and the top surface of the dielectric layer is greater than about 50 degrees, wherein the tangent line is drawn at a point where the second solder bump joins the dielectric layer.

Other embodiments are also disclosed.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A novel thermal compress bonding (TCB) process is provided. The intermediate stages of manufacturing various embodiments are illustrated. Throughout the various views and illustrative embodiments, like reference numbers are used to designate like elements.

Figure 1:
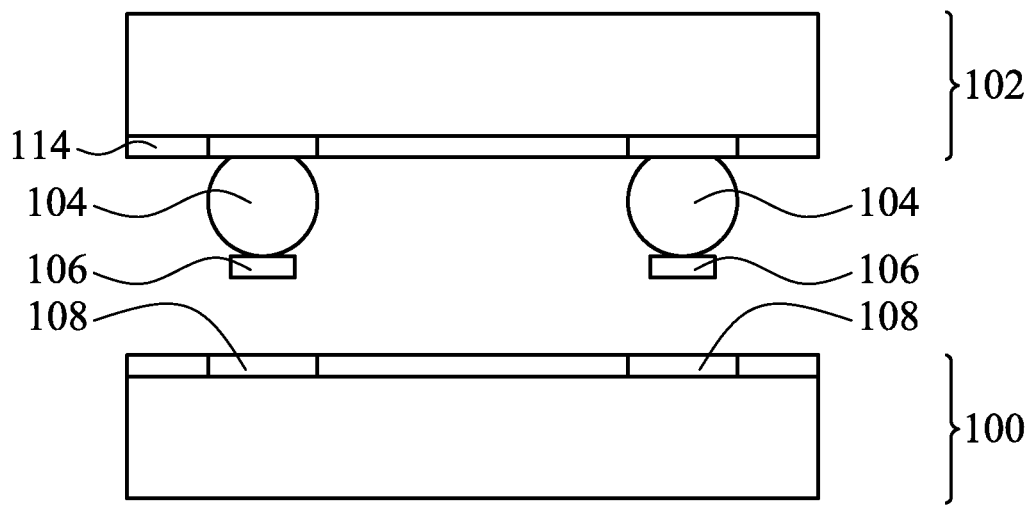
FIGS. 1 through 3 illustrate cross-sectional views of intermediate stages in a conventional bonding process.
Figure 2:
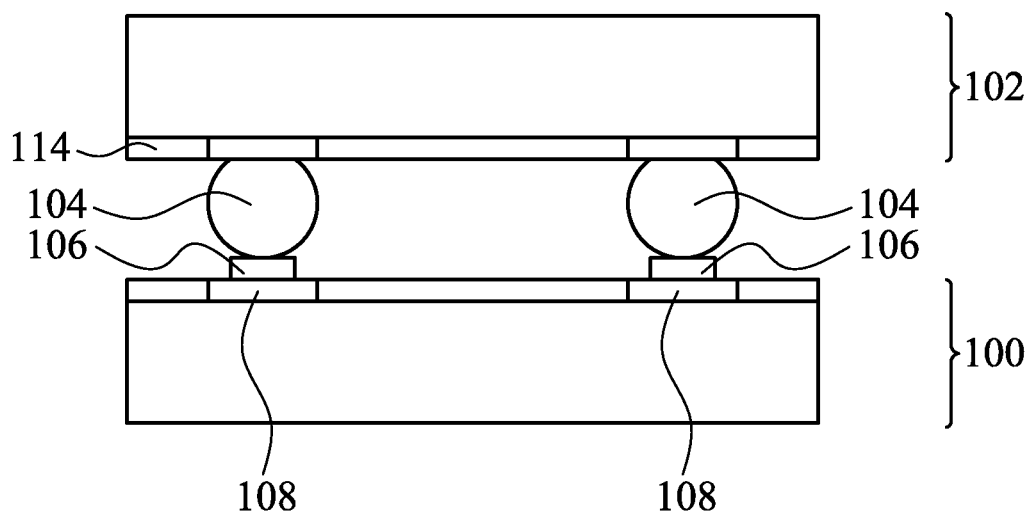
Figure 3:
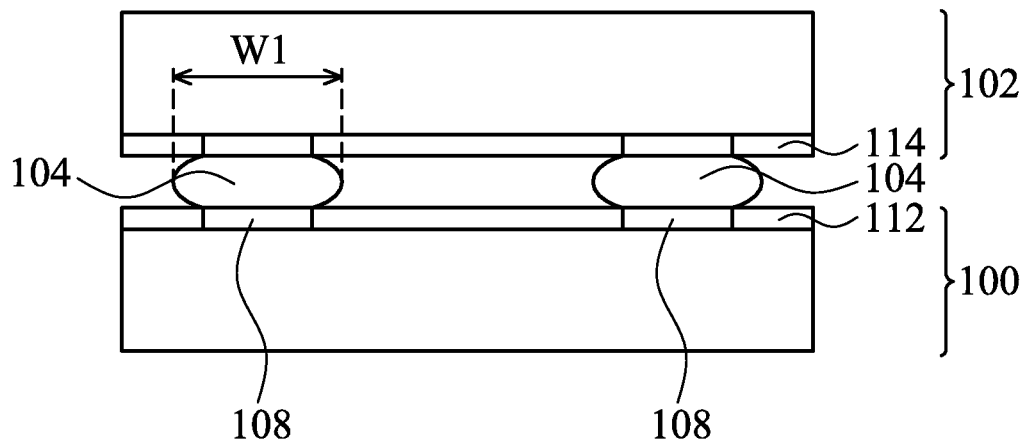
Figure 4:
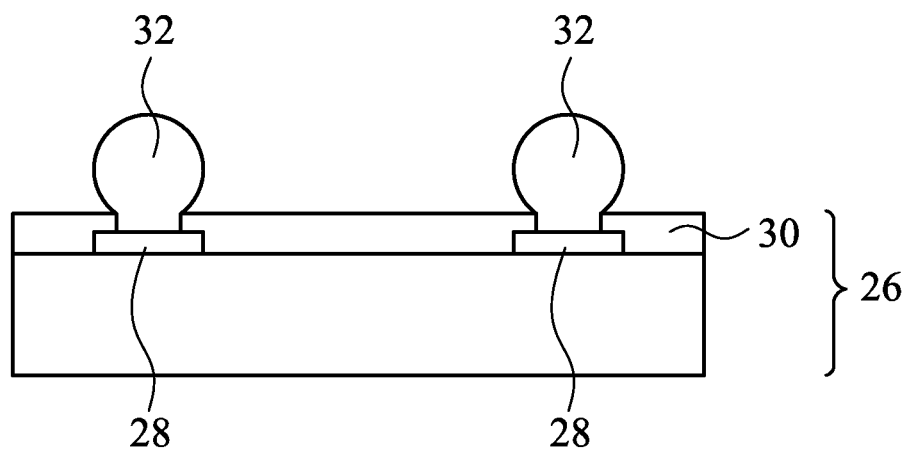
FIGS. 4 through 8B are cross-sectional views of intermediate stages in the manufacturing of a bond structure in accordance with various embodiments.

FIG. 4 illustrates a cross-sectional view of work piece 26. In an embodiment, work piece 26 is a package substrate or an interposer, which does not have active devices such as transistors therein. In alternative embodiments, work piece 26 is a device die having active devices such as transistors (not shown) therein. Metal pads 28 may be formed in work piece 26, and exposed through an opening in solder resist 30, which is formed of a dielectric material. Solder bumps 32 are formed on the top surface of, and are electrically coupled to, metal pads 28. Solder bumps 32 may include portions over dielectric layer 30, and portions extending into the openings in dielectric layer 30. In alternative embodiments, bumps 32 are non-reflowable metal bumps such as copper pillar bumps.

Figure 5A:
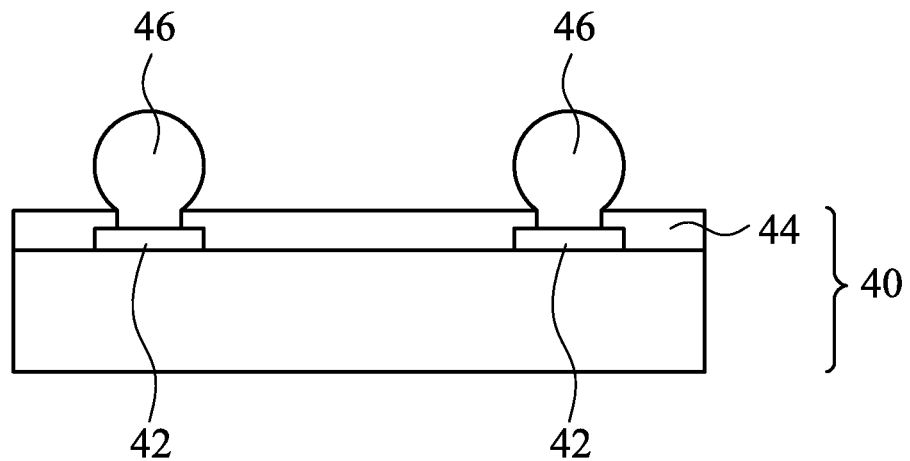
Figure 5B:
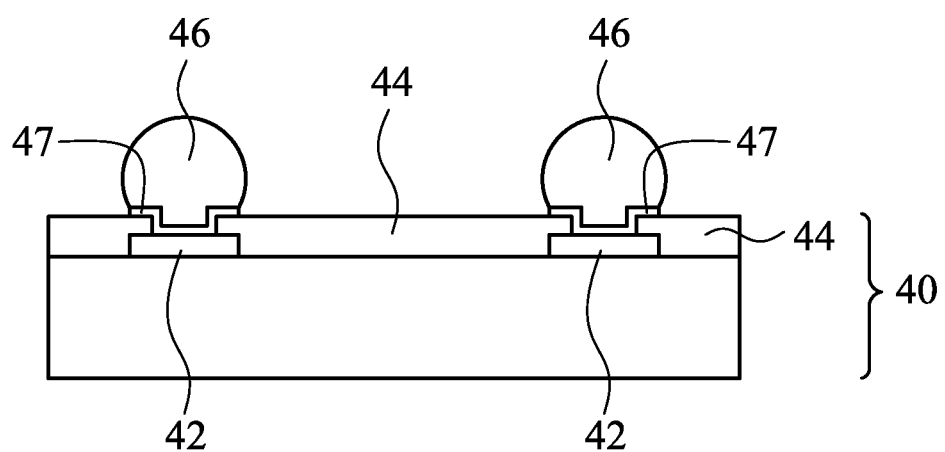

FIGS. 5A and 5B illustrate work pieces 40, which may be device dies (chips) comprising active devices (not shown) therein, wherein the active devices may be transistors. Alternatively, work pieces 40 may be interposers, package substrates, or the like. Metal pads 42 may be formed in work pieces 40. Dielectric layer 44 is formed over metal pads 42, and may be formed of polyimide, silicon oxide, silicon nitride, or the like. In an embodiment, as shown in FIG. 5A, solder bumps 46 are formed on the top surfaces of, and are electrically coupled to, metal pads 42. In alternative embodiments, as shown in FIG. 5B, under-bump metallurgies (UBMs) 47 are formed, with each of UBMs 47 including a portion extending into the respective opening in dielectric layer 44, and a portion over dielectric layer 44. Solder bumps 46 are formed on the top surfaces of the respective UBMs 47. UBMs 47 may comprise a titanium layer and a copper layer on the titanium layer, for example, although different metallic materials may be used. In an embodiment, bumps 46 are solder bumps, although they can be other type of bumps such as copper pillar bumps. However, at least one, and may be both, of metal bumps 32 (FIG. 4) and 46 are solder bumps. In the following illustrated exemplary embodiments, metal bumps 32 and 46 are all solder bumps.

Figure 6:
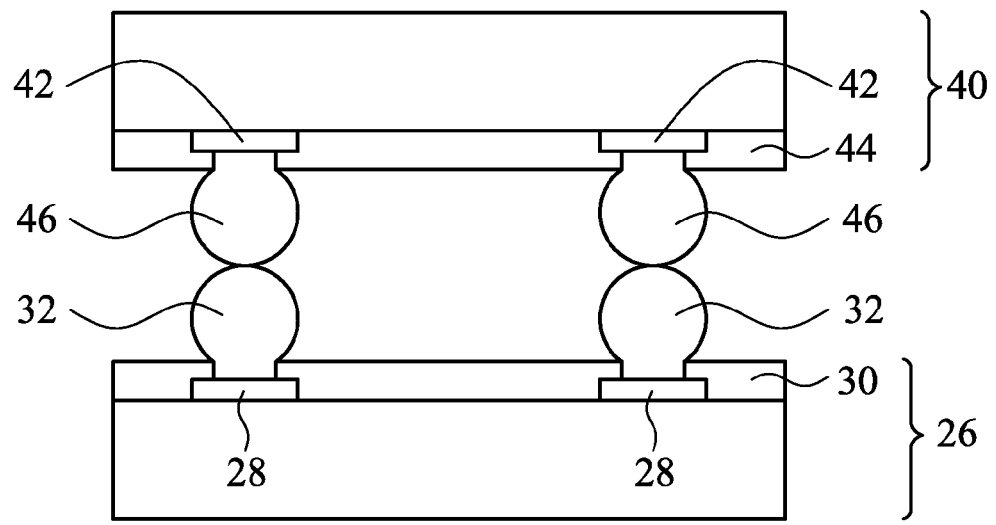
Figure 7:
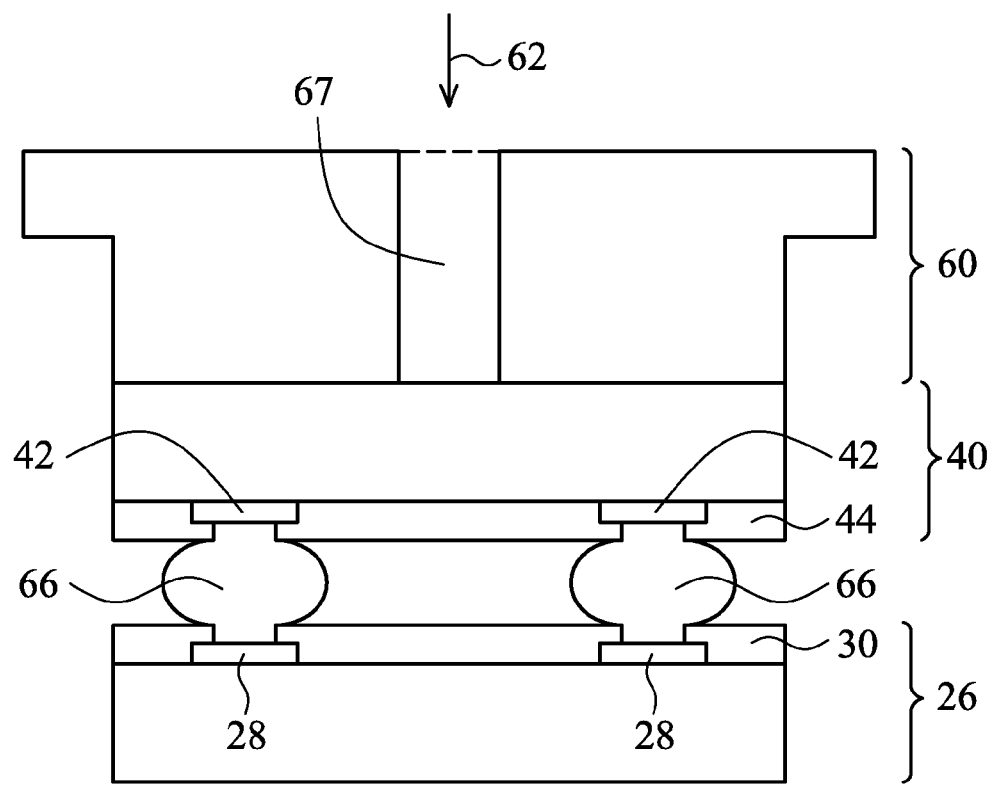

Referring to FIG. 6, work piece 40 is picked up, flipped over, and placed onto work piece 26. Metal bumps 32 are in contact with solder bumps 46. Next, as shown in FIG. 7, a bonding is performed. Heating tool 60 is placed over and contacting work piece 40, and may apply a downward force (symbolized by arrow 62) to work piece 40, so that metal bumps 32 and 46 are pressed against each other to prevent work piece 40 from slipping. Heating tool 60 heats work piece 40, and the heat is conducted to, and cause the reflow of, solder bumps 32 and 46. The resulting solder bumps formed of the combined solder bumps 32 and 46 are referred to as solder bumps 66. During the melting of solder bumps 32 and 46, downward force 62 may be, or may not be, applied.

Figure 8A:
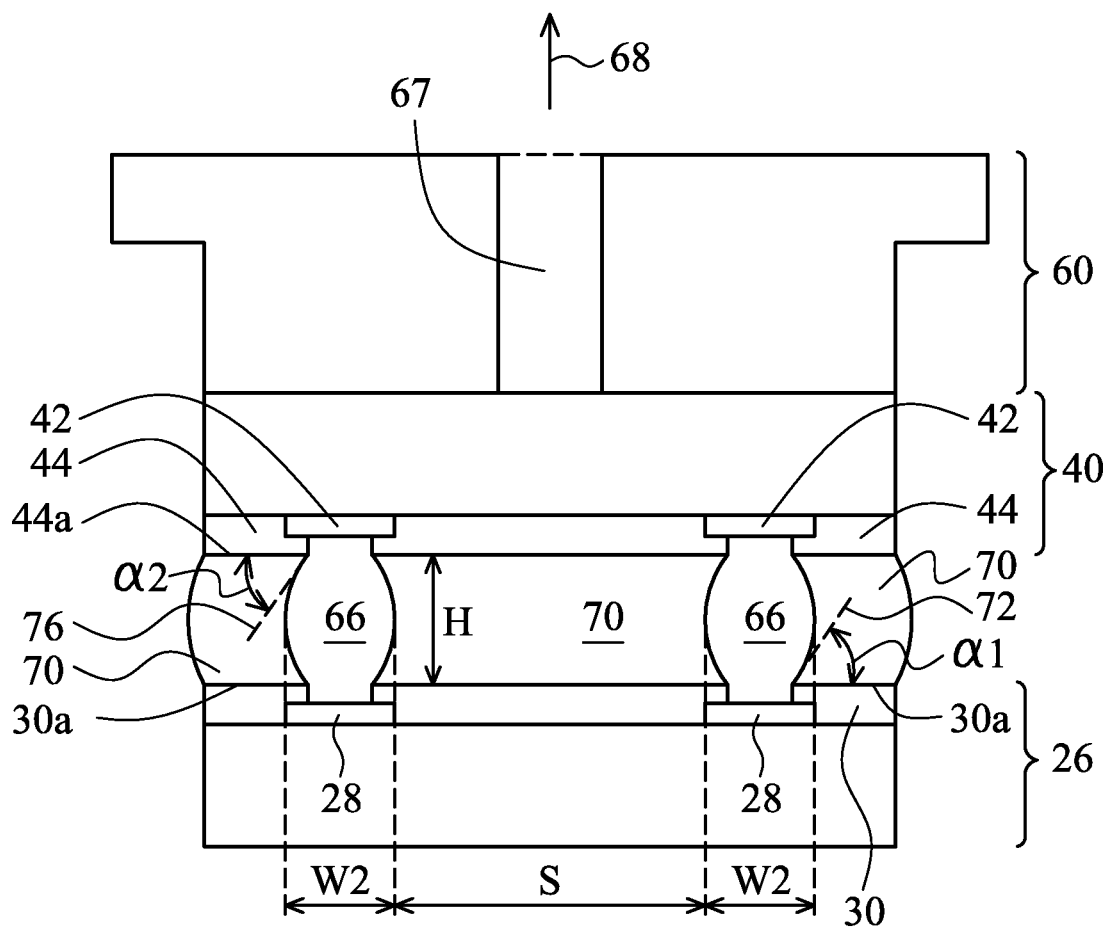
Figure 8B:
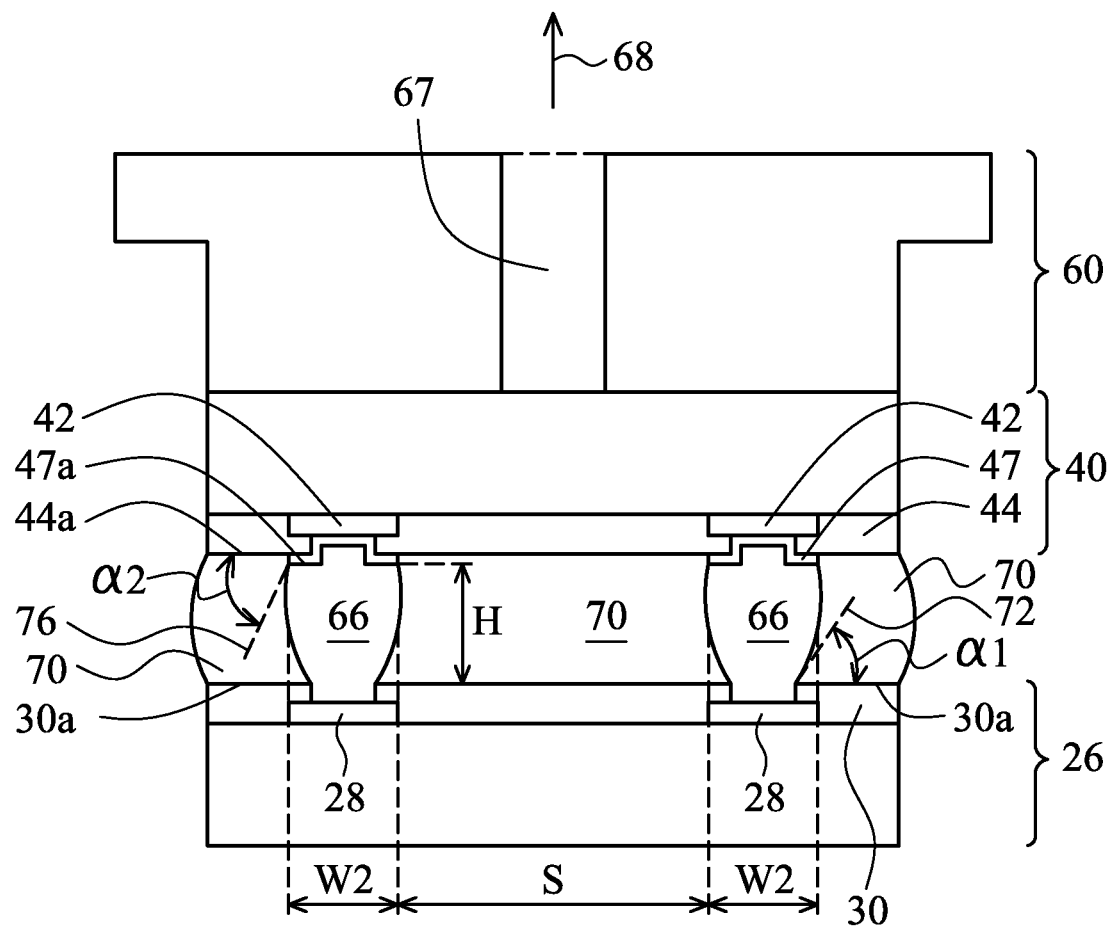

Referring to FIGS. 8A and 8B, after the reflow to form solder bumps 66 and before solder bumps 66 solidify, heating tool 60 applies an upward force, as symbolized by arrow 68, so that the height H of solder bumps 66 is increased, and horizontal size W2 of solder bumps 66 is reduced. The application of the upward force may be achieved, for example, by forming a vacuum in air duct 67 in heating tool 60 to suck work piece 40 up. The pulling up of work piece 40 is continued until angles $\alpha 1$ and $\alpha 2$ are higher than certain values (such as 50 degrees), as will be discussed in detail in subsequent paragraphs. The temperature of heating tool 60 is then reduced until solder bumps 66 solidify. The bonding process is then finished. After the bonding, underfill 70 is filled into the gap between work pieces 26 and 40.

In the resulting structure as shown in FIGS. 8A and 8B, at the joints where solder bumps 66 join dielectric layer 30, solder bumps 66 have tangent lines 72, which form angle $\alpha 1$ with horizontal surface 30a (which is in a horizontal plane) of dielectric layer 30. Each of tangent lines 72 may have one end meeting a joint of solder bumps 66 and dielectric layer 30, wherein the joint may be the corner of dielectric layer 30, which corner is where horizontal surface 30a intercepts a sidewall of dielectric layer 30. Similarly, at the joints where solder bumps 66 join dielectric layer 44, solder bumps 66 have tangent lines 76, which form angles $\alpha 2$ with horizontal surface 44a (which is in a horizontal plane) of dielectric layer 44. In the embodiment wherein UBMs 47 are formed in work piece 40, as shown in FIG. 8B, angles $\alpha 2$ may be considered as between tangent lines 76 and horizontal surface 47a of UBMs 47. In an embodiment, angles $\alpha 1$ and $\alpha 2$ are greater than about 50 degrees, greater than about 60 degrees, or even greater than about 75 degrees. It is known that increased angles $\alpha 1$ may result in the decrease in the stress at the corners where solder bumps 66 join dielectric layer 30, where the stress in solder bumps 66 is often the highest near the corners. Accordingly, the cracking in solder bumps 66 caused by the stress is reduced. Similarly, the increased angles $\alpha 2$ may result the decrease in the stress at the corners where solder bumps 66 join dielectric layer 44 or UBMs 47, and hence the reduction in the cracking in solder bumps 66. It is observed that when height H of solder bumps 66 is increased, angles $\alpha 1$ and $\alpha 2$ also increase. Accordingly, by pulling up work piece 40 in the reflow process, angles $\alpha 1$ and $\alpha 2$ may increase, and the cracking in solder bumps 66 may be reduced.

Figure 9:
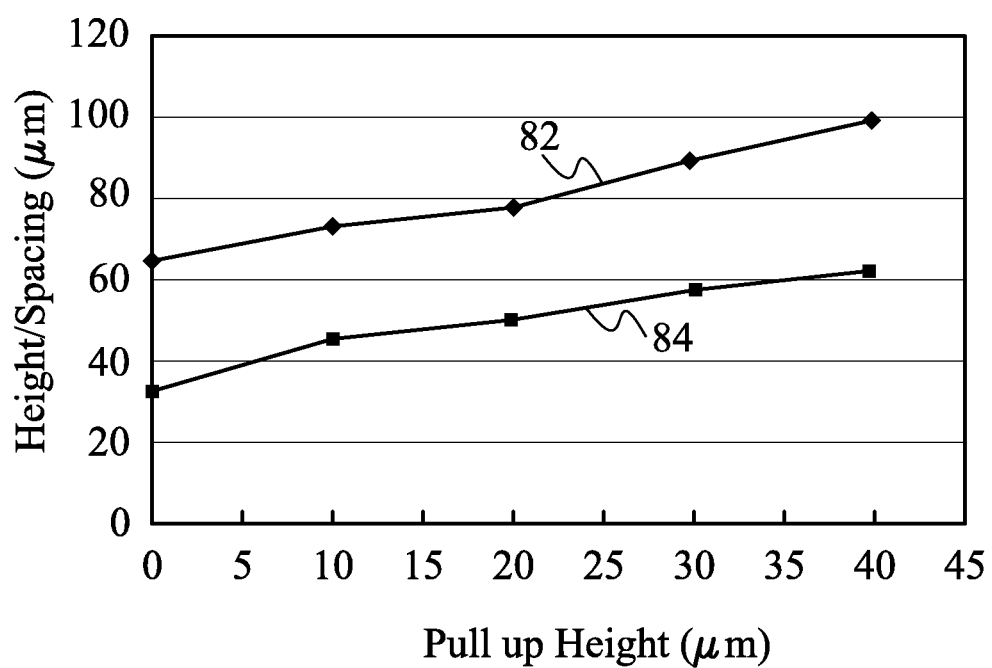
FIG. 9 illustrates spacing S (FIG. 8) between neighboring solder bumps as a function of pull up heights, and heights H of solder bumps as a function of the pull up heights.

The increase in height H also results in spacing S between neighboring solder bumps 66 to be increased. Assuming solder bumps 66 in some sample bond structures are pulled up from an original height H equal to 64 μm, and a pull up height is used to measure the increase in height H from the original height of 64 μm, then in FIG. 9, line 84 may be used to illustrate spacing S (FIGS. 8A and 8B) as a function of the pull up heights, and line 82 may be used to illustrate height H of solder bumps 66 as a function of the pull up height. It is observed that both spacing S and height H increase substantially linearly with the increase in the pull up height. In other words, by pulling up work piece 40 in the reflow process, spacing S may be increased linearly with the increase in solder bump height H. Accordingly, the risk of shorting is reduced when solder bump height H is increased, and solder bump density may be increased. The possibility of cracking in solder bumps 66 is also reduced.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
   placing a second work piece over a first work piece;
   placing a heating tool over and contacting the second work piece;
   heating the second work piece using the heating tool to melt a solder region between the first work piece and the second work piece;
   when the solder region is melted, pulling up the second work piece to increase a height of the solder region from a first height to a second height greater than the first height, wherein the second work piece is pulled up until an angle formed between a tangent line of the solder region and a top surface of a surface dielectric layer in the first work piece is greater than about 50 degrees, and wherein the tangent line is drawn starting from a joint of the solder region and the surface dielectric layer; and
   cooling the solder region, wherein after the step of cooling, the first work piece and the second work piece are bonded to each other through the solder region.

2. The method of claim 1, wherein the after the cooling, the solder region has the second height.

3. The method of claim 1, wherein the second work piece is pulled up through a vacuum formed in the heating tool.

4. The method of claim 1 further comprising, before pulling up the second work piece, pressing the second work piece against the first work piece.

5. The method of claim 1, wherein after the step of placing the second work piece over the first work piece, a first solder bump in the first work piece is in contact with a second solder bump in the second work piece, and wherein the solder region comprises solder from the first solder bump and the second bump.

6. The method of claim 1, wherein after the step of placing the second work piece over the first work piece, a first bump in the first work piece is in contact with a second bump in the second work piece, and wherein the solder region comprises solder from a first one of the first and the second bumps, and wherein a second one of the first bump and the second bump is a non-solder bump.

7. The method of claim 1, wherein the angle is greater than about 60 degrees.

8. The method of claim 1, wherein the angle is greater than about 75 degrees.

9. A method comprising:
placing a second work piece over a first work piece, wherein the first work piece comprises:
- a first dielectric layer having a top surface; and
- a first solder bump having a first portion over the first dielectric layer, and a second portion extending into the first dielectric layer, and wherein the second work piece comprises a second solder bump at a surface, and wherein the first and the second solder bumps contact each other;

placing a heating tool contacting the second work piece;
heating the second work piece using the heating tool to melt the first and the second solder bumps to form a third solder bump; and
before the third solder bump solidifies, pulling up the second work piece, until an angle formed between a tangent line of the second solder bump and the top surface of the dielectric layer is greater than about 50 degrees, wherein the tangent line is drawn starting from a joint of the third solder bump and the dielectric layer.

10. The method of claim 9, wherein the angle is greater than about 60 degrees.

11. The method of claim 10, wherein the angle is greater than about 75 degrees.

12. The method of claim 9, wherein the first work piece is a package substrate, and the second work piece is a device die.

13. The method of claim 9, wherein at a joint of the third solder bump and the second work piece, an additional tangent line of the second solder bump forms an additional angle greater than about 50 degrees with a horizontal surface of the second work piece.

* * * * *